(12) United States Patent
Li

(10) Patent No.: US 8,395,892 B2
(45) Date of Patent: Mar. 12, 2013

(54) AIR DUCT AND COMPUTER SYSTEM WITH THE AIR DUCT

(75) Inventor: Zhan-Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 321 days.

(21) Appl. No.: 12/961,294

(22) Filed: Dec. 6, 2010

(65) Prior Publication Data

US 2012/0020013 A1    Jan. 26, 2012

(30) Foreign Application Priority Data

Jul. 23, 2010  (CN) .......................... 2010 1 0235042

(51) Int. Cl.
*H05K 7/20* (2006.01)
*H05K 5/00* (2006.01)
*F28F 7/00* (2006.01)
*H01L 23/34* (2006.01)

(52) U.S. Cl. ................... 361/679.49; 361/695; 361/727; 454/184; 165/80.3; 257/712; 174/16.1

(58) Field of Classification Search .......................... 361/679.49–679.51, 695, 724–727; 454/184; 165/80.1–80.3, 185; 257/712, 721–722; 174/16.1, 252

See application file for complete search history.

(56) References Cited

U.S. PATENT DOCUMENTS

| | | | | |
|---|---|---|---|---|
| 7,397,660 | B2 * | 7/2008 | Strmiska et al. | 361/679.48 |
| 7,542,289 | B2 * | 6/2009 | Tsai et al. | 361/695 |
| 8,149,578 | B2 * | 4/2012 | Neumann et al. | 361/690 |
| 8,300,409 | B2 * | 10/2012 | Wei et al. | 361/690 |
| 2008/0117589 | A1 * | 5/2008 | Carrera et al. | 361/687 |
| 2010/0020487 | A1 * | 1/2010 | Lee et al. | 361/679.49 |
| 2010/0105313 | A1 * | 4/2010 | Tsai et al. | 454/284 |
| 2010/0165568 | A1 * | 7/2010 | Tsai et al. | 361/679.49 |

\* cited by examiner

*Primary Examiner* — Zachary M Pape
(74) *Attorney, Agent, or Firm* — Altis Law Group, Inc.

(57) ABSTRACT

An air duct includes a top panel and a blocking member rotatable secured to the top panel. A through hole is defined in the top panel, and a pair of clipping portions are located an edge of the through hole. The blocking member includes an operating portion and a blocking portion connected to the operating portion. The operating portion is located on an outside of the top panel, and the blocking portion is located on an inside of the top panel. The operating portion of the blocking member is passed through a bottom surface of the top panel through the through hole, extends to a top surface of the top panel, and engaged with the pair of clipping portions.

15 Claims, 5 Drawing Sheets

AIR DUCT AND COMPUTER SYSTEM WITH THE AIR DUCT

BACKGROUND

1. Technical Field

The present disclosure relates to a computer system with an airflow guiding duct.

2. Description of Related Art

An air duct is commonly used for facilitating heat dissipation of electronic components of a computer system. The air duct covers the electronic components of the computer system to guide airflow from fans to the electronic components. For a large sized computer system, such as a server system, which has a great number of electronic components, a large sized air duct is needed to dissipate a massive amount of heat from electronic components. However, when some of electronic components are removed, the air still flows through the space, left empty, thus decreasing the dissipation efficiency.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
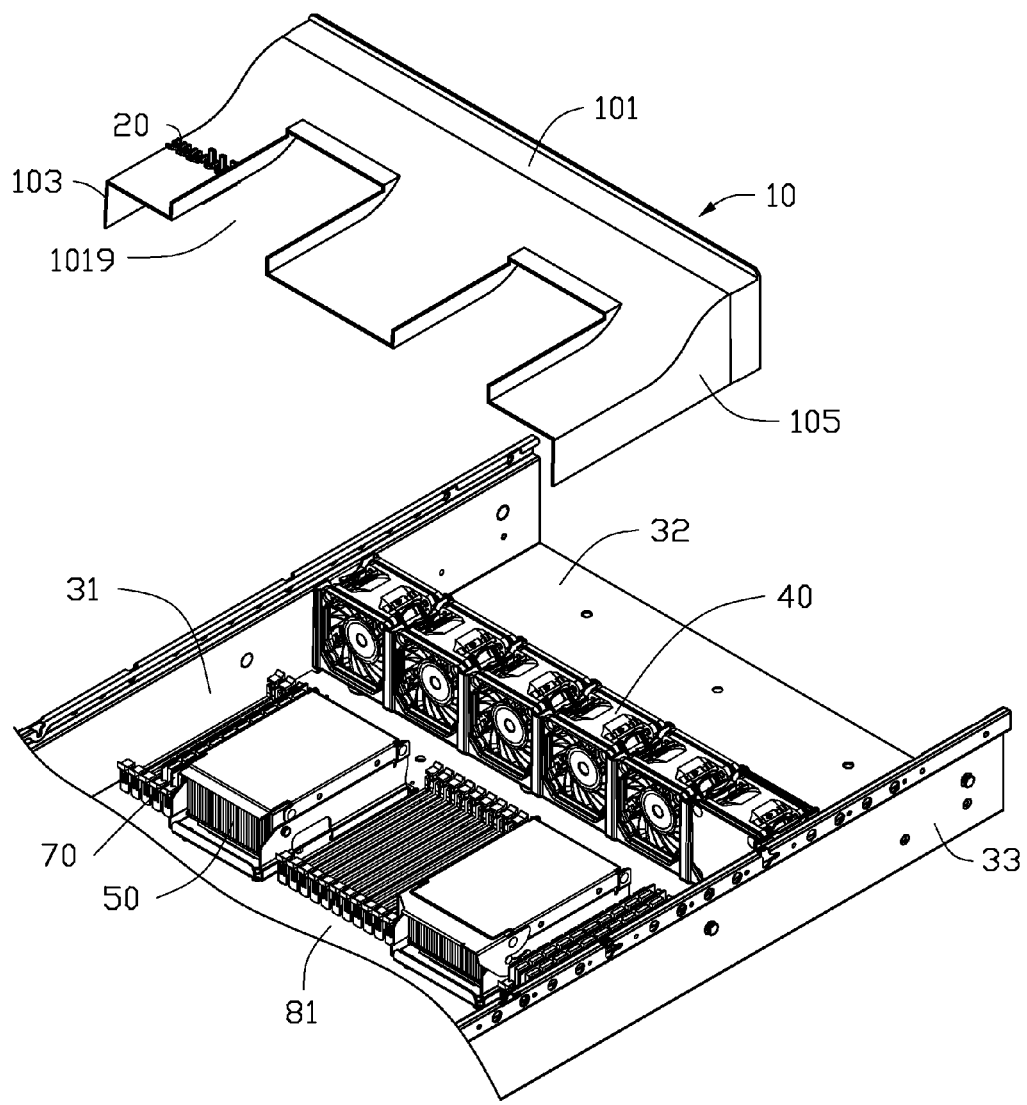
FIG. 1 is a partially exploded, isometric view of a computer system in accordance with an embodiment.

Referring to FIG. 1, a computer system in accordance with an embodiment includes a chassis 30 and an air duct 10 secured in the chassis 30.

The chassis 30 includes a bottom wall 32, and two side walls 31, 33 connected to the long edges of the bottom wall 32. In one embodiment, the two side walls 31, 33 are substantially parallel to each other, and substantially perpendicular to the bottom wall 32. A motherboard 81 is secured to the inner surface of the bottom wall 32. Two heat sinks 50 are mounted on the motherboard 81, for dissipating the heat from a chip, such as a CPU. A number of memory chips 70 are attached to the motherboard 81, adjacent to each heat sink 50. A number of fans 40 are secured between the two side walls 31, 33 with securing tray (not labeled).

Figure 2:
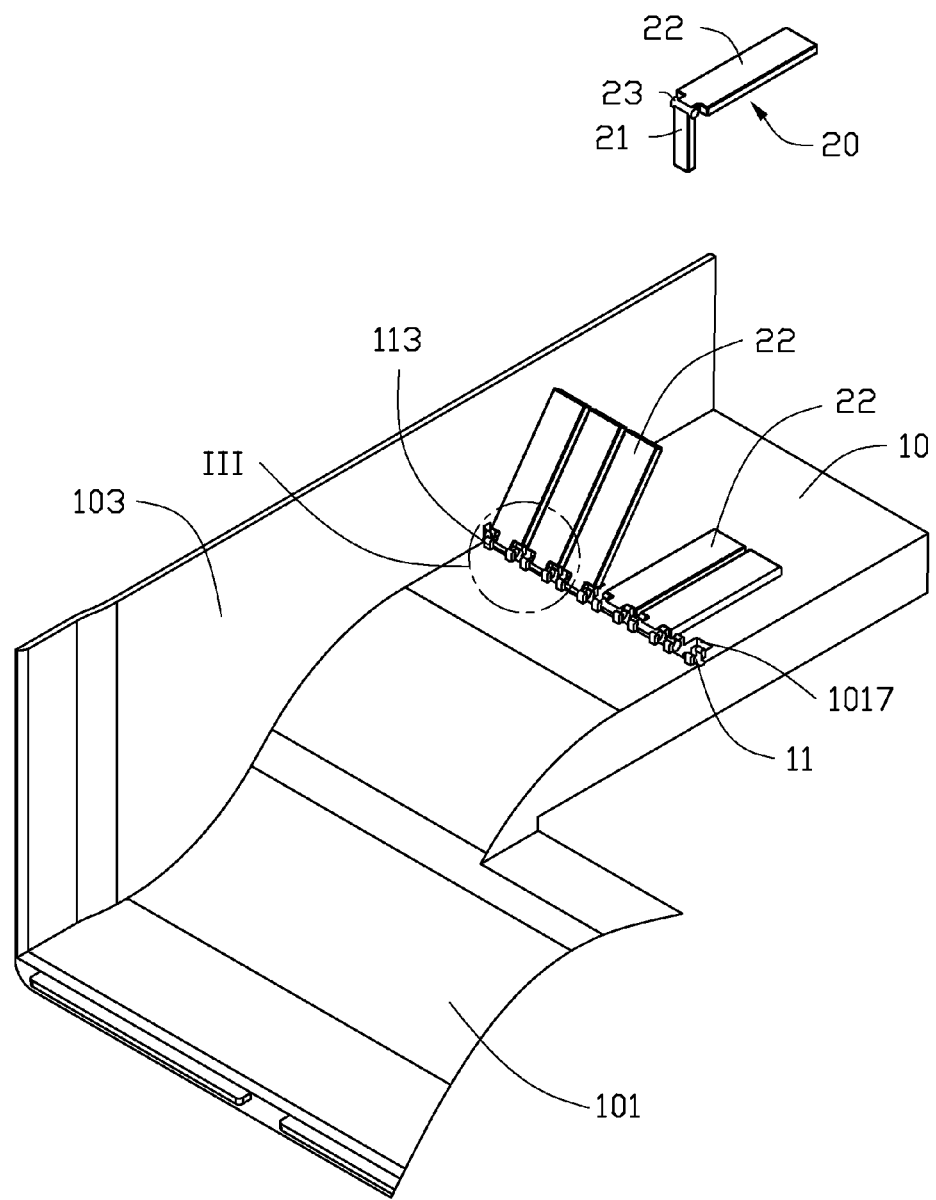
FIG. 2 is a partially exploded, isometric view of an air duct of the computer system in accordance with an embodiment.
Figure 3:
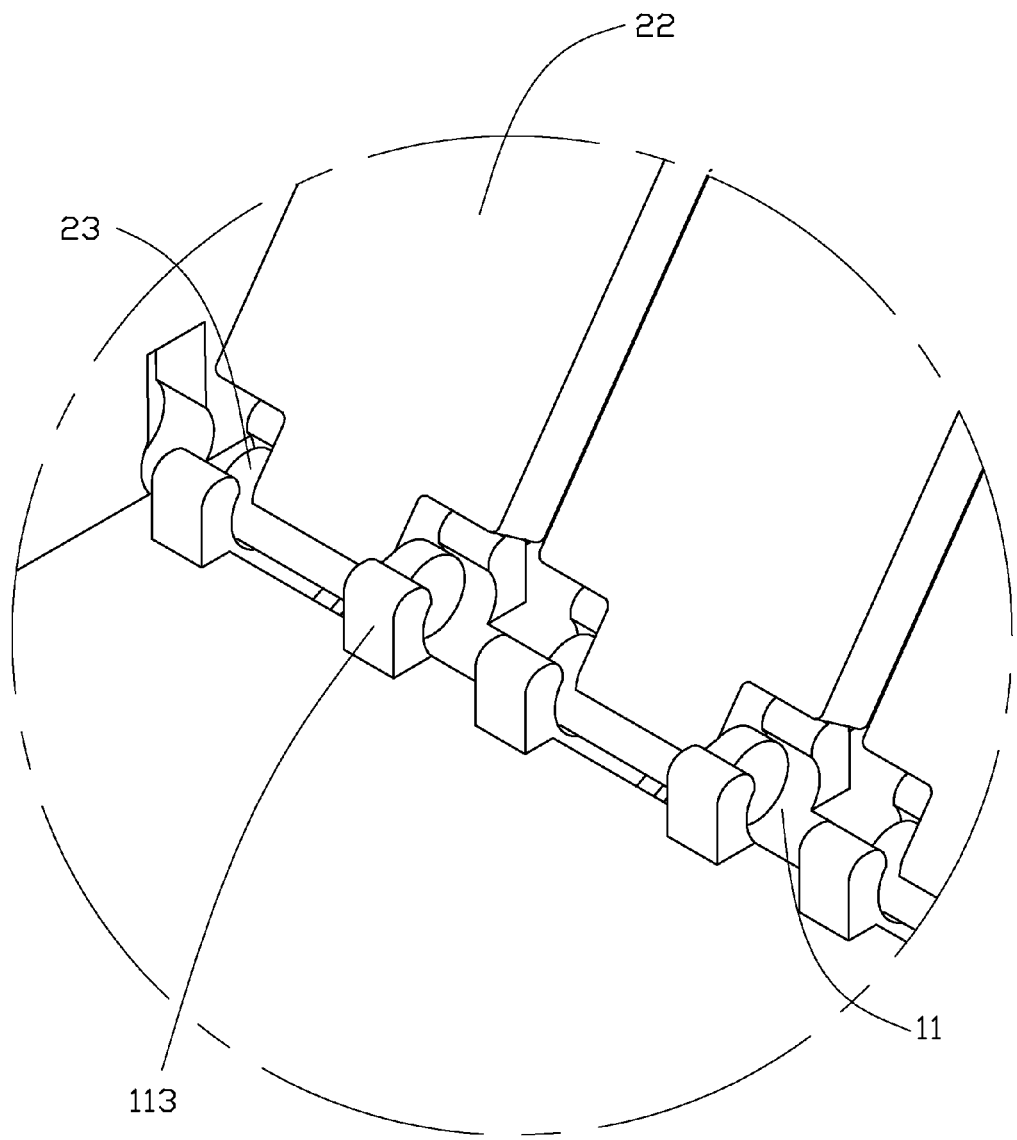
FIG. 3 is an enlarged view of circled portion III of FIG. 2.
Figure 4:
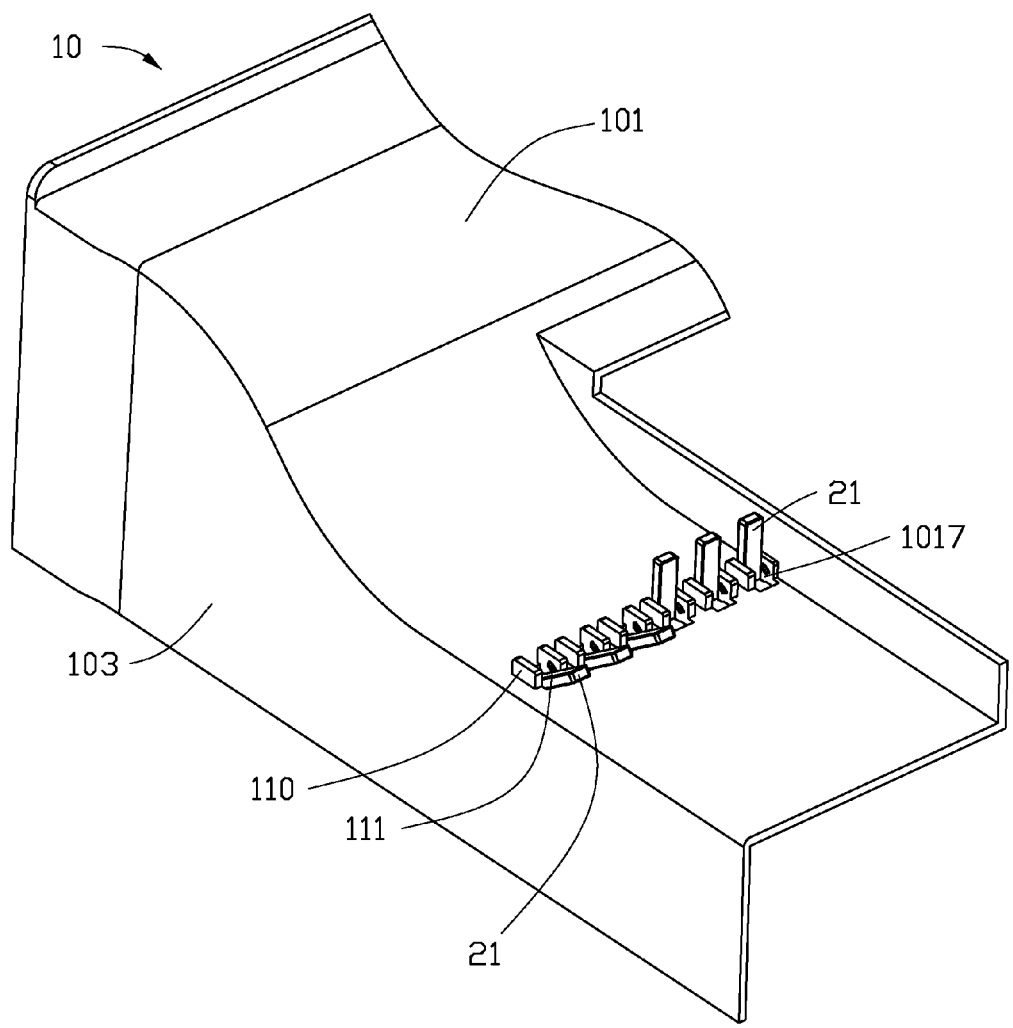
FIG. 4 is an assembled view of FIG. 2, showing in a different aspect, three blocking members in a first position, and three blocking members in a second position.

Referring to FIGS. 2-4, the air duct 10 includes a top panel 101, two side panels 103, 105 extending from two opposite side edges of the top panel 101, and a number of blocking members 20. In one embodiment, the side panels 103, 105 are substantially perpendicular to the top panel 101. Two openings 1019 are defined on the top panel 101, to separate the top panel 101 into three portions. A number of through holes 1017 are defined in a left portion of the top panel 101. A pair of parallel retaining portions 110 is disposed on two opposite edges of each through hole 1017, located on a top surface of the top panel 101. Two pairs of clipping portions 113 are respectively disposed on two opposite edges of each through hole 1017, located on a bottom surface of the top panel 101. In one embodiment, the retaining portions 110 and the clipping portions 113 can be elastically deformed. A block 111 is disposed on an inner surface of each retaining portions 110. A channel 11 is defined by each pair of clipping portions 113. In one embodiment, an inner surface of the clipping portion 113 is an arc, and the inner surface of the clipping portion 113 and an inner surface of the top panel 101 form the channel 11.

Each blocking member 20 includes an operating portion 21, a blocking portion 22, and a rotatable shaft 23 connecting the operating portion 21 and the blocking portion 22, configured for being rotatably secured to the channel 11. In one embodiment, the length and the width of the operating portion 21 is less than that of the blocking portion 22. The width of the operating portion 21 is less that of two opposite edges of the through hole 1017, but greater than a distance between the two blocks 111 of each pair of retaining portions 110. In one embodiment, the two opposite edges of the through hole 1017 are substantially parallel to the side panels 103, 105. A diameter of the rotatable shaft 23 is larger than the shortest distance of each pair of clipping portions 113, but greater than the longest of each pair of clipping portions 113. In one embodiment, the operating portion 21 is substantially perpendicular to the blocking portion 22.

Figure 5:
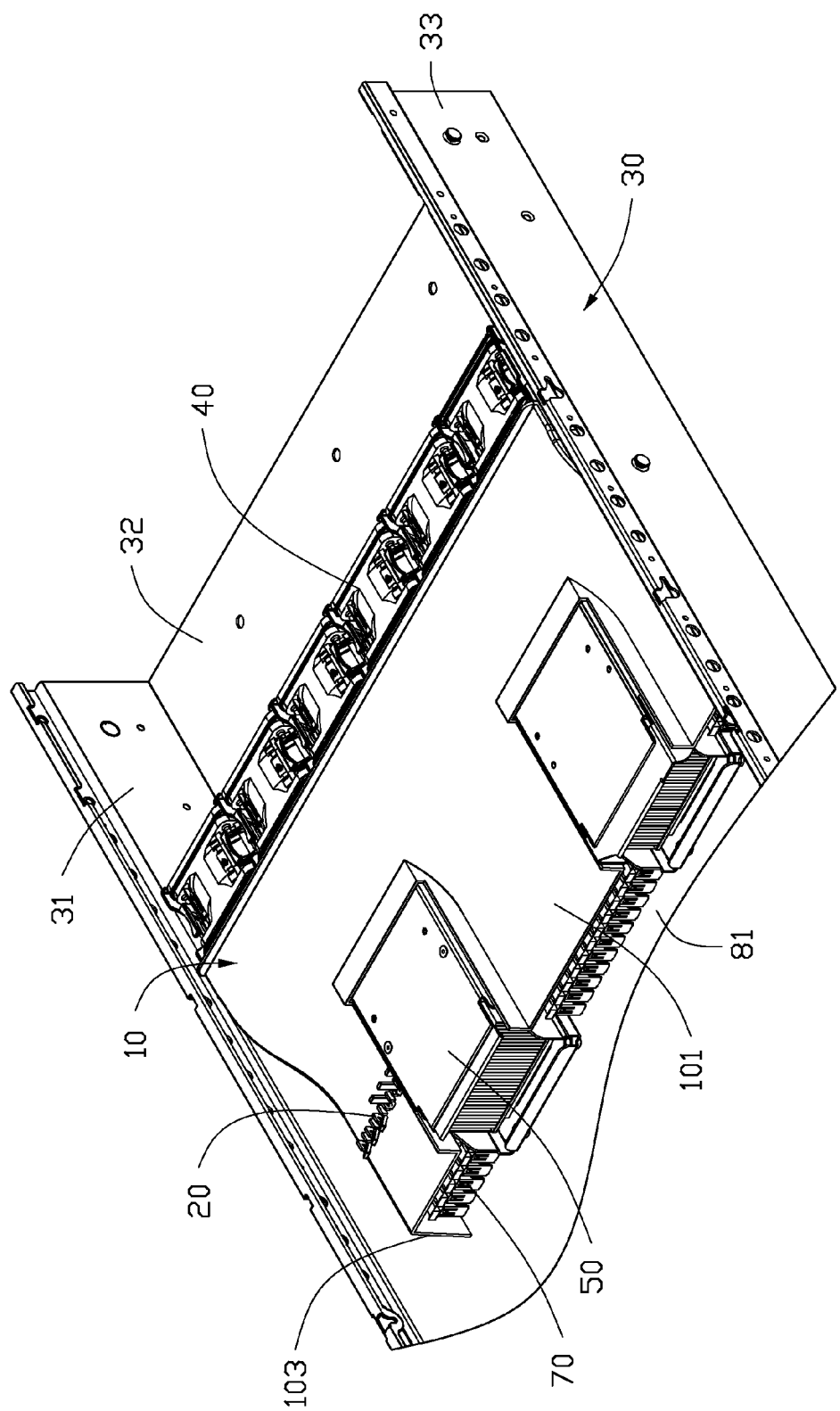
FIG. 5 is an assembled view of FIG. 1.

Referring to FIG. 5, in assembly, the operating portion 21 of the blocking member 20 is passed through the bottom surface of the top panel 101 through the through hole 1017, extends to the top surface of the top panel 101, and is located between the pair of retaining portions 110. The rotatable shaft 23 of the blocking member 20 is placed on an entrance of the channel 11 formed by the pair of the clipping portions 113. Then, the blocking member 20 is inserted, to elastically deform the pair of the clipping portions 113 in opposite directions, and the rotatable shaft 23 is inserted into the channel 11. When the pair of clipping portions 113 is released, the rotatable shaft 23 is thus rotatably clipped in the channel 11 by the clipping portions 113.

Referring to FIGS. 3 and 4, the blocking member 20 can be rotated between a first position and a second position. In the first position, the operating portion 21 is substantially perpendicular to the top panel 101 of the air duct 10, stopped by the block 111 of the retaining portions 110, and the blocking portion 22 is substantially parallel to top panel 101. In the second position, the operating portion 21 is adjacent to the top surface of the top panel 101 and stopped by the block 111, a first acute angle is formed between the operating portion 21 and the top panel 101, and a second acute angle is formed between the blocking portion 22 and the top panel 101.

When the blocking member 20 is rotated from the first position to the second position, the operating portion 21 presses the block 111 of the retaining portion 110, to elastically deform the pair of retaining portions 110 in an opposite direction, until the operating portion 21 is passed across the block 111. When the operating portion 21 has passed across the block 111, the pair of retaining portions 110 are moved in a direction near to each other, and the operating portion 21 is stopped by the block 111.

Referring to FIG. 5, in use, the air duct 10 is placed on the motherboard 81, and located one side of the fans 40. The air duct 10 having the blocking member 20 is located on the memory chips 70, and the two heat sinks 50 are respectively received in the two openings 1019. Therefore, the air duct 10 can guide the airflow from the fans 40 to the two heat sinks 50 and the memory chips 70.

When the memory chips 70 are arranged under the blocking member 20, the blocking member 20 is rotated to the first position. Then, the blocking member 20 does not stop the airflow from the fans 40, and the airflow can flow through between the memory chips 70 under the blocking member 20.

When the memory chips 70 are not arranged under the blocking member 20, the blocking member 20 is rotated to the second position from the first position. Then, the blocking member 20 stops the airflow from the fans 40, and the airflow is not wasted on vacant space. Therefore, the airflow can be concentrated on the two heat sinks 50, and effectively dissipate the heat the components that are present.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. An air duct comprising: a top panel; and a blocking member rotatably secured to the top panel, a through hole defined in the top panel, and a pair of clipping portions located on an edge of the through hole, the blocking member comprising an operating portion and a blocking portion connected to the operating portion, the operating portion located on an outside of the top panel, and the blocking portion located on an inside of the top panel; wherein the operating portion of the blocking member is passed through a bottom surface of the top panel through the through hole, extends to a top surface of the top panel, and is engaged with the pair of clipping portions wherein the operating portion is substantially perpendicular to the blocking portion, and wherein the blocking member is configured to rotate between a first position and a second position; in the first position, the operating portion is substantially perpendicular to the top panel, and the blocking portion is substantially parallel to the top panel; and in the second position, a first acute angle is defined between the operating portion and the top panel, and a second acute angle is defined between the blocking portion and the top panel.

2. The air duct of claim 1, wherein a pair of elastic retaining portions are disposed on opposite edges of the through hole, located on the outside of the top panel, and a block is disposed on each retaining portion.

3. The air duct of claim 2, wherein the operating portion abuts the block when the blocking member is located in the first position or the second position.

4. The air duct of claim 1, wherein the blocking member comprises a rotatable shaft between the operating portion and the blocking portion, and the rotatable shaft is rotatably accommodated in the pair of clipping portions.

5. The air duct of claim 4, wherein a channel is defined in the pair of the clipping portion, and the rotatable shaft is received in the channel.

6. The air duct of claim 1, wherein the length of the operating portion is less than that of the blocking portion.

7. The air duct of claim 1, wherein the width of the operating portion is less than that of the blocking portion.

8. A computer system comprising: a chassis comprising a bottom wall and two side walls connected to the bottom wall; a fan located on the bottom wall, between the two side walls; a motherboard attached to the bottom wall, and securing a memory chip; an air duct for guiding airflow from the fan, comprising a top panel and a blocking member rotatably secured to the top panel, the blocking member comprising an operating portion and a blocking portion connected to the operating portion, the operating portion located on an outside of the top panel, and the blocking portion located on an inside of the top panel; wherein the air duct is attached to the fan, the blocking member is located between a first position and a second position, in the first position, the operating portion is substantially perpendicular to the top panel, allowing the airflow to flow into the memory chip, in the second position, a first acute angle is formed between the operating portion and the top panel, preventing the airflow from passing through the air duct, wherein the operating portion is substantially perpendicular to the blocking portion, and wherein the blocking portion is substantially parallel to the to panel when the blocking member is in the first position, and a second acute angle is formed by the blocking portion and the top panel, when the blocking member is in the second position.

9. The computer system of claim 8, wherein a through hole is defined in the top panel, and the operating portion of the blocking member is passed through a bottom surface of the top panel via the through hole and extends to a top surface of the top panel.

10. The computer system of claim 9, wherein a pair of elastic retaining portion is disposed on opposite edges of the through hole, located on the outside of the top panel, and a block is disposed on each retaining portion.

11. The computer system of claim 10, wherein the operating portion abuts the block, when the blocking member is located in the first position or the second position.

12. The computer system of claim 11, wherein a pair of elastic clipping portions is disposed on opposite edges of the through hole, located on the inside of the top panel, the blocking member comprises a rotatable shaft between the first and second blocking portions, and the rotatable shaft is rotatably accommodated in the pair of elastic clipping portions.

13. The computer system of claim 8, wherein the top panel defines an opening, and a heat sink secured to the motherboard is engaged in the opening.

14. The computer system of claim 8, wherein the length of the operating portion is less than that of the blocking portion.

15. The computer system of claim 8, wherein the width of the operating portion is less than that of the blocking portion.

* * * * *